United States Patent [19]

Hoeft

[11] 3,821,658

[45] June 28, 1974

[54] PHASE LOCKED LOOP WITH MEMORY

[75] Inventor: Werner H. Hoeft, San Jose, Calif.

[73] Assignee: Signetics Corporation, Sunnyvale, Calif.

[22] Filed: Apr. 26, 1973

[21] Appl. No.: 354,531

[52] U.S. Cl. .......................... 331/8, 331/17, 331/27

[51] Int. Cl. .......................... H03b 3/04

[58] Field of Search .......................... 331/8, 17, 27

[56] References Cited

UNITED STATES PATENTS

| | | | |
|---|---|---|---|
| 3,582,809 | 6/1971 | Rigby | 331/8 |
| 3,657,665 | 4/1972 | Kimura | 331/17 |
| 3,701,039 | 10/1972 | Lang et al. | 331/17 X |

*Primary Examiner*—Herman Karl Saalbach
*Assistant Examiner*—Siegfried H. Grimm
*Attorney, Agent, or Firm*—Flehr, Hohbach, Test, Albritton & Herbert

[57] ABSTRACT

An integrated circuit phase locked loop which includes a low pass filter for preventing carrier dropout which has a long time constant. Such time constant is provided by current mirrors connected to the phase comparator of the phase locked loop which effectively drop the full supply voltage in the form of complementary error currents across relatively high impedance resistors.

3 Claims, 3 Drawing Figures

PHASE LOCKED LOOP WITH MEMORY

BACKGROUND OF THE INVENTION

The present invention is directed to a phase locked loop with a memory circuit which is especially useful for avoiding carrier dropout in a variety of decoder or demodulation systems.

In the specific case of a quadraphonic decoder for decoding a quadraphonic signal from a disk type record, when the record grooves become worn there is a problem of carrier dropout. More specifically, as disclosed in Takahashi U.S. Pat. No. 3,686,471 in the channels which are recorded on each side of a record groove there is an FM modulated A − B signal having carrier frequency of, for example, 30 kHz. In decoding such signal a phase locked loop is typically used. In the book entitled "Phase Locked Techniques" by Floyd M. Gardner, published by John Wiley & Sons, 1966, there is mentioned on page 51 that the memory of the phase locked loop should be adjusted to avoid dropout. Such precautions, of course, must not interfere with the ability of the circuit to track the modulation of the carrier. In addition, where the phase locked loop is in an integrated circuit format, normal circuit configurations may make it difficult to provide an effective memory circuit with a large time constant.

OBJECT AND SUMMARY OF THE INVENTION

It is, therefore, an object of the present invention to provide a phase locked loop in integrated format which has improved immunity against carrier dropout.

In accordance with the above object there is provided an integrated circuit phase locked loop where a voltage controlled oscillator (VCO) is responsive to the magnitude of an input control signal for producing an output signal having a frequency related to the magnitude. A phase detector compares the phase of an input signal with the phase of an output signal of the VCO and produces an error signal in response to a lack of phase comparison. Means couple the error signal to the VCO which serves as the input control signal of the VCO and includes memory means having charge storage means coupled to high impedance means. The high impedance means include current mirror means for reflecting complementary error signal currents from the phase detector which terminate such currents in a pair of high impedance resistors to provide a slow charge decay for said memory means.

DETAILED DESCRIPTION OF THE PREFERRED EMBODIMENT

Figure 1:
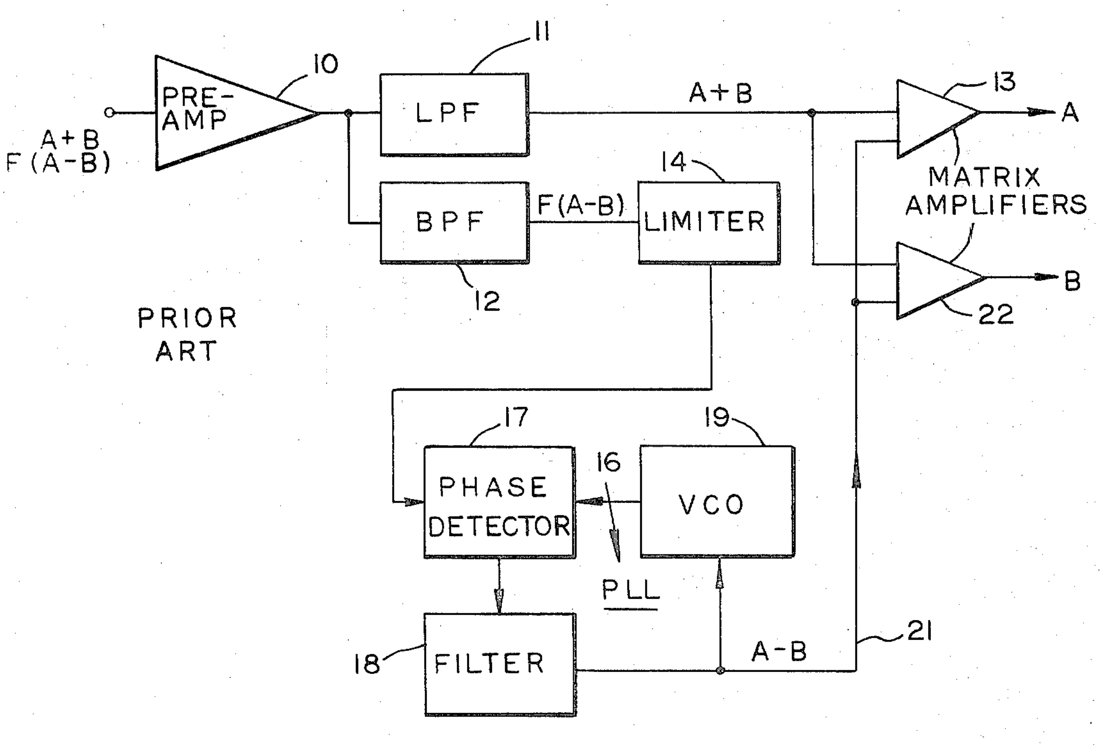
FIG. 1 is a block diagram of one half of a quadraphonic decoder embodying the present invention.

FIG. 1 illustrates one half of a quadraphonic decoder such as that shown in Takahashi U.S. Pat. No. 3,686,471. The figure represents merely one channel of a decoder which would, for example, decode a multiplex signal reproduced from one wall of a record groove. As illustrated, this consists of a sum signal, A + B, and a frequency modulated difference signal F(A−B). The signals are preamplified at preamplifier 10 and then separated into two components by a low pass filter 11 and a bandpass filter 12. The A + B output of low pass filter 11 is coupled to the matrix amplifier 15. The output of bandpass filter 12 is coupled to a limiter 14 and then to a demodulator 16 which is in the form of a phase locked loop. Such loop includes phase detector or comparator 17, a low pass filter 18, and a voltage controlled oscillator (VCO) 19. The output of the phase locked loop occurs on the line 21 which is A − B and is coupled to the matrix amplifier 22. By matrixing the A + B and A − B signals, A and B signals are produced which will be coupled to the front and rear speakers of a stereo quadraphonic sound system.

Figure 2:
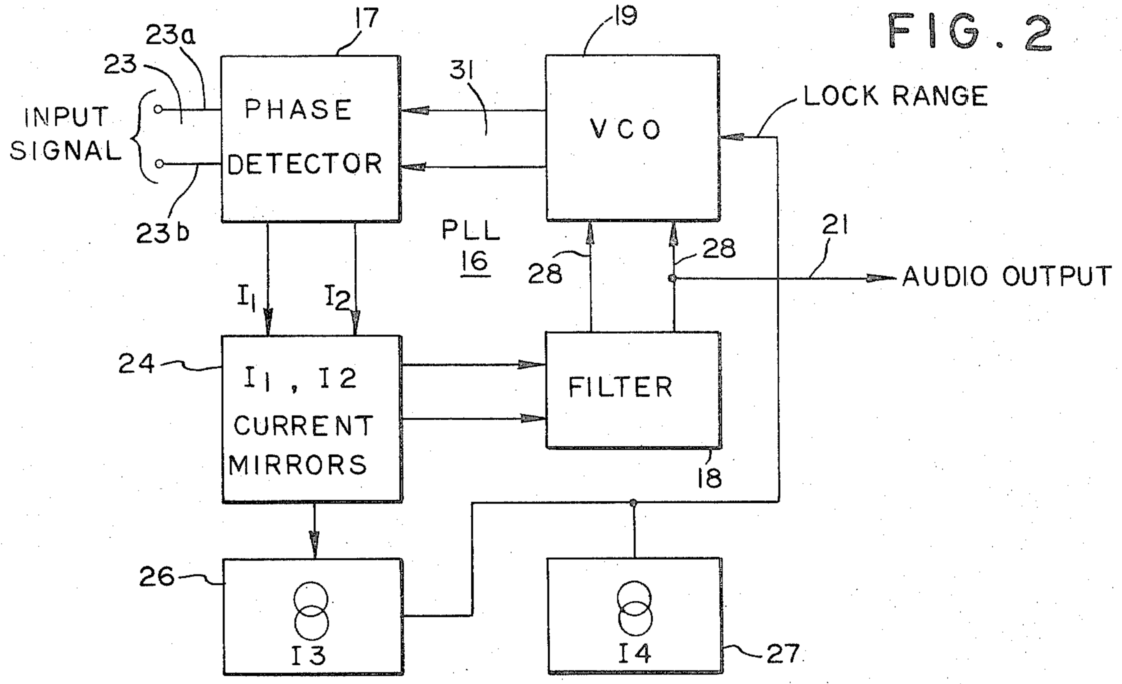
FIG. 2 is a more detailed block diagram of a portion of FIG. 1.

The present invention resides in an improvement in the phase locked loop of FIG. 1 which is also illustrated in greater detail in FIG. 2. Phase detector 17 has its frequency modulated input signal inputed to it in a complementary fashion by the line pair 23 with the individual lines 23a and 23b. Detector 17 is coupled to the filter arrangement 18 by a current interface unit 24 having complementary currents I1 and I2. Current sources 26 and 27 provide the currents I3 and I4 which are coupled to VCO 19 to provide for the setting of the dc lock range of the phase locked loop. This is discussed more fully in a copending application entitled "Voltage Controlled Oscillator" in the name of Alan B. Grebene, Ser. No. 283,555, filed Aug. 24, 1972 and assigned to the present assignee. In general, the ratio of I3 to I4 determines the locking range.

Filter 18 is coupled to VCO 19 by the complementary lines 28. One of the lines 21 also provides the audio output.

VCO 19 is similar to the above-mentioned Grebene patent application or may be patterned after the VCO shown in Rigby U.S. Pat. No. 3,582,809 issued June 1, 1971 and assigned to the present assignee.

Figure 3:
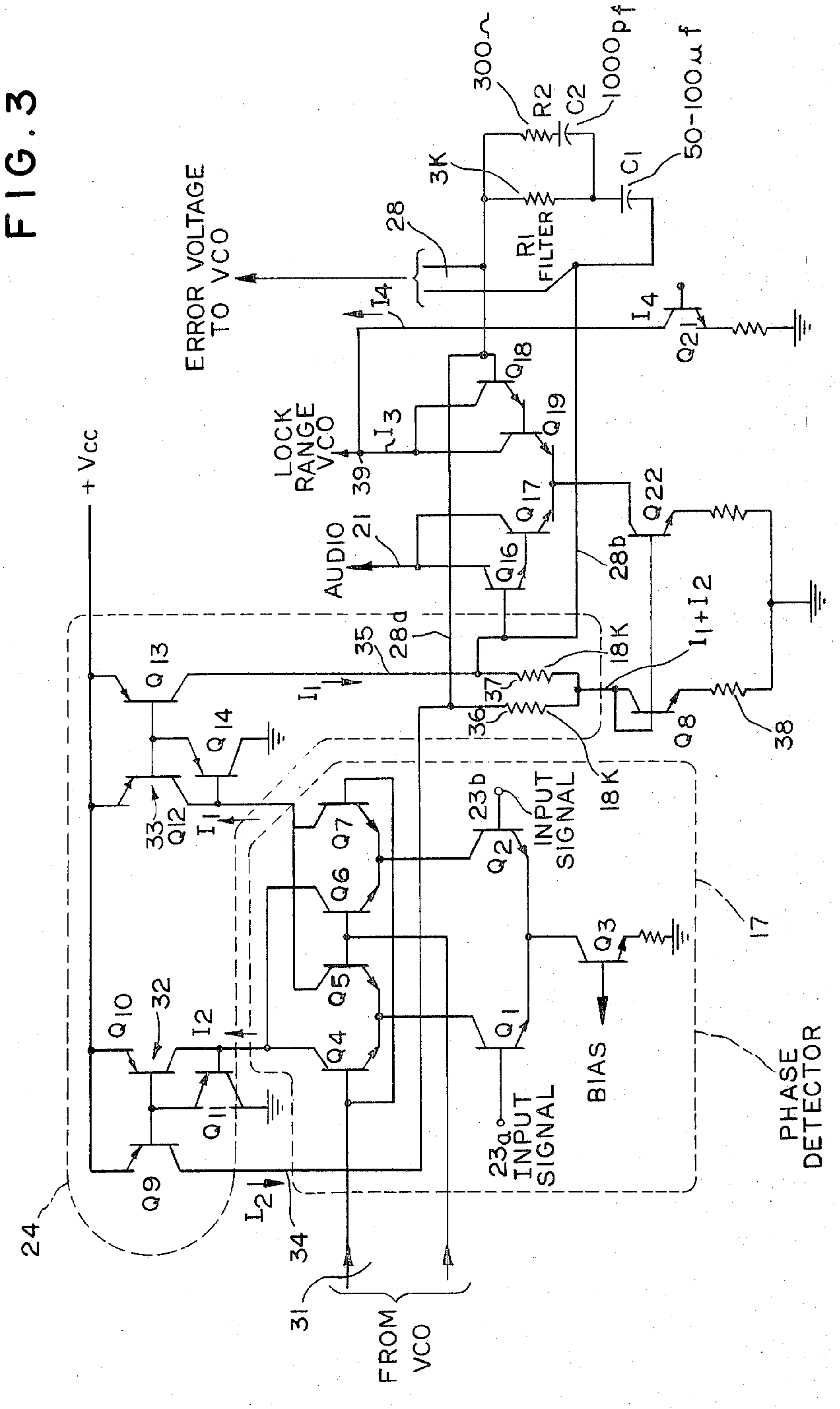
FIG. 3 is a yet more detailed circuit diagram of a portion of FIG. 2.

Referring now to FIG. 3, phase detector 17 shown within the dashed box is very similar to that used in the above-mentioned Rigby patent. The input signals are applied in a complementary fashion to the base of transistors Q1 and Q2 which have their emitters tied and coupled to the bias transistor Q3. Phase detector 17 compares the high frequency input from the VCO 19 on line pair 31 with the complementary input signals on lines 23a and 23b by the transistors Q4, Q5, Q6 and Q7 which form a balanced bipolar analog multiplier circuit. The tied collectors of Q4, Q6, Q5, Q7 produce the complementary error current signals I1 and I2 which are coupled to current mirrors 32 and 33. These current mirrors are a portion of the interface circuit 24 illustrated in FIG. 2. In effect, the current mirrors 32 and 33 turn the current I1 and I2 around from the $+V_{cc}$ voltage supply onto lines 34 and 35 respectively and terminate such currents in a pair of high impedance resistors 36 and 37, typically each having a value of 18 kilohms. The two resistors 36 and 37 are coupled to ground through a diode connected transistor Q8 and a resistor 38.

Current mirror 32 includes transistors Q9 and Q10 with their emitters coupled to $+V_{cc}$, the collector of Q10 receiving I2 and the collector of Q9 providing I2 to the summing resistor 36. Q11 serves as a current multiplier and has its base coupled to the collectors of Q4, Q6 and its emitter coupled to the tied bases of Q9 and Q10. Current mirror 33 includes transistors Q12,

Q13 and Q14 connected in a similar configuration but with respect to the current I1.

Currents I1 and I2 on lines 34 and 35 are coupled to VCO 19 on the line pair 28, including lines 28*a* and 28*b*. Coupled across lines 28*a* and 28*b* are two pairs of Darlington connected transistors Q16, Q17 and Q18, Q19. These provide a high impedance with respect to the complementary currents I1 and I2. The base of Q16 is coupled to line 28*b* and provides the audio output line 21. The base of Q18 is coupled to 28*a* and is part of the current generator 26 which provides the current I3 which sets the locking range of VCO 19. Current I4 is summed at junction 39 with I3 and is produced by the transistor Q21 which is part of the current source 27 as illustrated in FIG. 2. The tied emitters of Q17 and Q19 are coupled to the collector of transistor Q22 which has its base input coupled to Q8.

In accordance with the invention filter 18 is also coupled to lines 28*a* and 28*b* and in essence consists of two individual filters. The first includes resistor R1 and C1 with the approximate preferred values indicated and serves as a memory to prevent carrier dropout as, for example, explained above in the case of a worn record groove. C1 is a relatively large capacitor so that at frequencies below the lowest wanted modulation frequency it will tend to maintain the previously stored charge level on capacitor C1. More importantly, this is accomplished by reason of the relatively large time constant providing a slow charge decay due to the high impedance of the associated circuit. This includes the 18 kilohm resistors 36 and 37 along with the high impedance base inputs to Q16 and Q18. The line pair 28 coupling the error voltage to the VCO would as is shown both in the Grebene application and the Rigby patent also be high impedance base inputs. Lastly, the collector connection of lines 34 and 35 causes the transistors Q9 and Q13 to serve as high impedance insulators because of their back biased junctions.

The second more typical portion of filter 18 includes resistor R2 and capacitor C2 with their associated typical values. This serves as a low pass filter which has a cutoff frequency just below the highest desired audio frequency to be demodulated. In addition, of course, $C_1$ and the high internal impedance of the circuit act as a low pass filter with the cutoff frequency below the lowest wanted modulation frequency. R1 is also used for setting the ac lock range of the circuit.

Consequently instead of observing that filter 18 is coupled across a high impedance circuit it can be observed that a large voltage of the order of magnitude of the supply voltage, $V_{cc}$, is dropped across resistors 36 and 37 by transistors Q9 and Q13 of the current mirrors.

Thus, the present invention provides a decoding circuit of the phase locked loop type which can track both frequency changes and intermittent carrier losses, without interfering with the tracking of the carrier modulation. In addition to use as a quadraphonic decoder, the circuit also finds applications in FM receivers and clock recovery systems for disk or tape.

I claim:

1. In an integrated circuit phase locked loop, a voltage controlled oscillator (VCO) responsive to the magnitude of an input control signal for producing an output signal having a frequency related to such magnitude; a phase detector for comparing the phase of an input signal with the phase of said output signal of said VCO and producing an error signal in the form of complementary currents in response to a lack of phase coincidence; means for coupling said error signal to said VCO to serve as said input control signal including memory means having charge storage means coupled to high impedance means said high impedance means including current mirror means coupled to said phase detector for reflecting said complementary error signal currents from said phase detector and including a pair of high impedance resistors for terminating such reflected currents to provide a slow charge decay for said memory means said charge storage means being coupled across said resistor pair and said error signal being coupled to said VCO from said memory means.

2. A phase locked loop in claim 1 where said current mirror means is connected to a dc supply voltage and where said current means drops a large voltage of the order of magnitude of the dc supply voltage across said resistor pair.

3. A phase locked loop as in claim 1 where said complementary error signal currents are respectively coupled to an audio amplifier and a lock range control of said VCO by means of Darlington connected transistors which provide a high input impedance with respect to said complementary currents.

* * * * *